US006774739B2

(12) United States Patent
Yamaji et al.

(10) Patent No.: US 6,774,739 B2
(45) Date of Patent: Aug. 10, 2004

(54) FREQUENCY CONVERTER, ORTHOGONAL DEMODULATOR AND ORTHOGONAL MODULATOR

(75) Inventors: Takafumi Yamaji, Yokohama (JP); Osamu Watanabe, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 10/141,977

(22) Filed: May 10, 2002

(65) Prior Publication Data

US 2002/0167369 A1 Nov. 14, 2002

(30) Foreign Application Priority Data

May 11, 2001 (JP) ....................................... 2001-141158
May 7, 2002 (JP) ....................................... 2002-131266

(51) Int. Cl.[7] .................................................. H03C 3/00
(52) U.S. Cl. ....................................... 332/103; 327/113
(58) Field of Search ................................ 332/103, 117, 332/177, 164; 327/113, 101, 105, 119

(56) References Cited

U.S. PATENT DOCUMENTS 4,207,521 A * 6/1980 Takada ........................ 455/20
5,262,957 A * 11/1993 Hearn ......................... 702/76
5,408,698 A * 4/1995 Serizawa et al. ........ 455/245.1
5,416,449 A 5/1995 Joshi .......................... 327/113
5,995,819 A 11/1999 Yamaji et al. .............. 455/326

FOREIGN PATENT DOCUMENTS

| | | |
|---|---|---|
| EP | 0214491 A | 3/1987 |
| FR | 2449999 A | 9/1980 |

* cited by examiner

*Primary Examiner*—Linh M. Nguyen
(74) *Attorney, Agent, or Firm*—Oblon, Spivak, McClelland, Maier & Neustadt, P.C.

(57) ABSTRACT

A frequency converter comprising a variable gain amplifier which amplifies the local oscillation signal according to a gain control signal and outputs an amplified local signal, an even harmonic mixer which is supplied with an input signal and an amplified local oscillation signal and outputs an output signal whose frequency is a sum of a first frequency of the input signal and a second frequency of two or more even numbered times a frequency of the amplified local oscillation signal, an amplitude detector which is supplied with the amplified local oscillation signal and outputs a direct current signal having an amplitude corresponding to an amplitude of the amplified local oscillation signal, and a comparator which compares the direct current signal of the amplitude detector with the reference direct current signal to generate an output signal as the gain control signal.

18 Claims, 5 Drawing Sheets

FREQUENCY CONVERTER, ORTHOGONAL DEMODULATOR AND ORTHOGONAL MODULATOR

CROSS-REFERENCE TO RELATED APPLICATIONS

This application is based upon and claims the benefit of priority from the prior Japanese Patent Applications No. 2001-141158, filed May 11, 2001; and No. 2002-131266, filed May 7, 2002, the entire contents of both of which are incorporated herein by reference.

BACKGROUND OF THE INVENTION

1. Field of the Invention

The present invention relates to a frequency converter, more particularly to a frequency converter used for radio communications.

2. Description of the Related Art

A direct conversion receiving system suitable for miniaturization due to the reduced number of parts has been put to practical use with the penetration of radio communication terminal such as portable telephone. However, the direct conversion system uses a local oscillation signal (LO signal) of substantially the same frequency as the receiver signal (RF signal) frequency that is received by a radio antenna. For this reason, the direct conversion system includes a problem such as a self-mixture that the leakage LO signal enters in a receiver signal channel and becomes a jamming signal. As one method to solve this is suggested a method to use LO signal of approximately half frequency of the receiver signal. According to this method, approximately half frequency of RF signal frequency is used as LO signal frequency.

A direct conversion receiver comprises an even harmonic mixer using half frequency of RF signal frequency. This direct conversion receiver has property suitable for the direct conversion because this receiver does not indicate theoretically sensitivity to the LO signal even if the LO signal frequency enters in the receiver signal channel. However, the even harmonic mixer includes a problem that when the LO signal amplitude fluctuates by temperature change, the conversion gain has varied with this fluctuation, that is, the gain of the receiver does not indicate a target value.

Further, the gain greatly varies when the LO signal generator which is sensitive to the temperature change is used. In order to solve this problem, the conventional device has employed a method of inputting the LO signal to a limiting circuit to make the amplitude constant, and then inputting the LO signal to an even harmonic mixer. However, this method needs a filter for eliminating the harmonic component because many harmonic components of the LO signal occur in the limiting circuit. Generally it is difficult to integrate this filter on a chip.

Further, it obstructs an advantage of the direct conversion that the number of parts can be reduced to provide the filter between the LO signal generator and the even harmonic mixer. Since the conversion gain of the even harmonic mixer depends upon fluctuation of the LO signal amplitude, it is difficult to combine the even harmonic mixer with the cheap oscillation circuit by which the LO signal amplitude is fluctuated in easy.

It is an object of the present invention to provide a frequency converter that can utilize an advantage of an even harmonic mixer that the sensitivity deterioration due to self-mixture is small, without increase of parts.

BRIEF SUMMARY OF THE INVENTION

According to an aspect of the present invention, there is provided a frequency converter to which an input signal, a local oscillation signal and a reference direct current signal is supplied, the frequency converter comprising: a variable gain amplifier which amplifies the local oscillation signal according to a gain control signal and outputs an amplified local signal; an even harmonic mixer which is supplied with the input signal and the amplified local oscillation signal and outputs an output signal whose frequency is a sum of a first frequency of the input signal and a second frequency of two or more even numbered times a frequency of the amplified local oscillation signal or a difference between the first frequency and the second frequency; an amplitude detector which is supplied with the amplified local oscillation signal and outputs a direct current signal having an amplitude corresponding to an amplitude of the amplified local oscillation signal; and a comparator which compares the direct current signal of the amplitude detector with the reference direct current signal to generate an output signal as the gain control signal.

According to another aspect of the present invention, there is provided an orthogonal demodulator to which an input signal, a first local oscillation signal, a second local oscillation signal, a first reference signal, and a second reference signal, the orthogonal demodulator comprising: a first frequency converter including: a first variable gain amplifier which amplifies the first local oscillation signal according to a first gain control signal, and outputs an amplified first local oscillation signal; a first even harmonic mixer which is supplied with the input signal and the amplified first local oscillation signal and outputs an output signal whose frequency corresponds to a difference between a frequency of the input signal and a frequency of two or more even numbered times a frequency of the amplified first local oscillation signal; a first amplitude detector which is supplied with the amplified first local oscillation signal and outputs a first direct current signal having an amplitude corresponding to an amplitude of the amplified first local oscillation signal; and a first comparator which compares the first reference direct current signal with the first direct current signal to generate an output signal as the first gain control signal; a second frequency converter including: a second variable gain amplifier which amplifies the second local oscillation signal according to a second gain control signal, and outputs an amplified second local oscillation signal; a second even harmonic mixer which is supplied with the input signal and the amplified second local oscillation signal and outputs an output signal whose frequency corresponds to a difference between a frequency of the input signal and a frequency of two or more even numbered times a frequency of the amplified second local oscillation signal; a second amplitude detector which is supplied with the amplified second local oscillation signal and outputs a second direct current signal having an amplitude corresponding to an amplitude of the amplified second local oscillation signal; and a second comparator which compares the second reference direct current signal with the second direct current signal to generate an output signal as the second gain control signal; and a phase shifter which outputs the first local oscillation signal and the second local oscillation signal with a given phase difference therebetween to the first frequency converter and the second frequency converter.

DETAILED DESCRIPTION OF THE INVENTION

The embodiments of the present invention will hereinafter be described with reference to the attached drawings.

(The First Embodiment)

Figure 1:
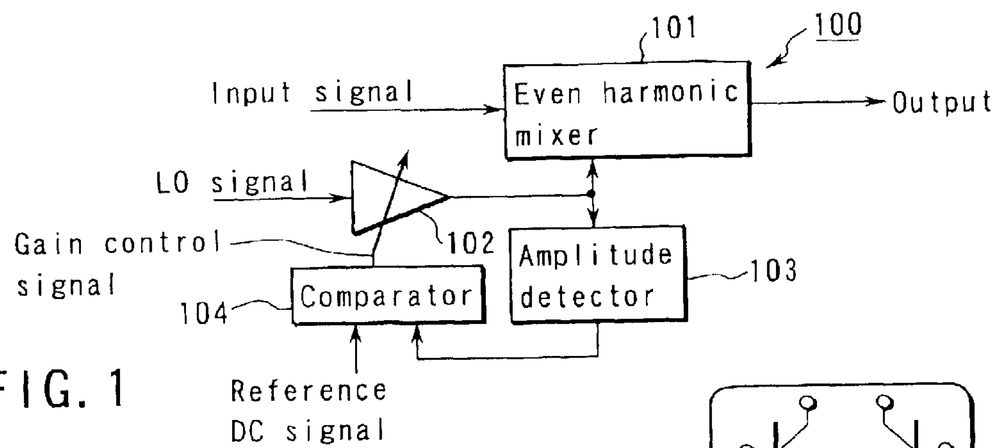
FIG. 1 is a block diagram of a frequency converter related to the first embodiment of the present invention.

FIG. 1 shows a block diagram of frequency converter related to the first embodiment of the present invention. There will now be described a frequency converter used for a receiving system which down-converts a received signal (RF signal) received via a radio antenna (not shown).

A frequency converter 100 shown in FIG. 1 comprises an even harmonic mixer 101, a LO signal variable gain amplifier 102, an amplitude detector 103 and a comparator 104. An input signal (RF signal or a modulated signal) and a local oscillation signal (LO signal) amplified by the LO signal variable gain amplifier 102 are input to the even harmonic mixer 101, so that the input signal is converted to the frequency corresponding to the difference between the input signal and a signal whose frequency is two or more even numbered times (two times, for example) the LO signal frequency.

The conversion gain of the even harmonic mixer 101 varies according to the LO signal amplitude. Therefore, the LO signal generated by the local oscillator (not shown) is amplified to a desired LO signal amplitude by the LO signal variable gain amplifier 102. The LO signal amplified to the desired amplitude (an output of the LO signal variable gain amplifier 102) is input to the first even harmonic mixer 101. The desired LO signal amplitude is the LO signal amplitude by which the conversion gain of the even harmonic mixer becomes maximum when making much account of the noise property of the frequency converter 100. When making much account of distortion property, it is preferable that the desired LO signal amplitude is amplified more greatly than the LO signal amplitude that the conversion gain becomes maximum, to obtain the LO signal amplitude of the status that the conversion gain falls to a little.

Detection of this amplitude is necessary in order to keep the LO signal amplitude at a desired value. The output of the LO signal variable gain amplifier 102 is input to the amplitude detector 103 and converted into the direct current signal which met the amplitude. The comparator 104 compares the output of the amplitude detector 103 with a reference direct current signal externally supplied. The output of the comparator 104 is input to the LO signal variable gain amplifier 102 as a gain control signal. In other words, the LO signal variable gain amplifier 102, amplitude detector 103 and comparator 104 constructs a feedback loop.

The LO signal amplitude amplified by the LO signal variable gain amplifier 102 is determined by the magnitude of the reference direct current signal thanks to this feedback loop. As a result, the conversion gain of the even harmonic mixer 101 is kept uniformity.

Since the frequency converter 100 uses a variable gain amplifier, it hardly generates higher harmonics. For this reason, the filter to remove the higher harmonics is not needed. Thus, the frequency converter 100 can be fabricated as an integrated circuit. Although the area of this integrated circuit increases somewhat, the number of parts of the receiver does not increase.

Figure 2:
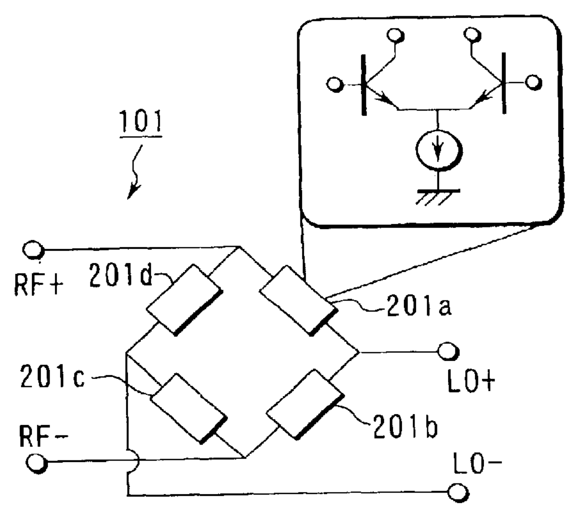
FIG. 2 shows an example of the even harmonic mixer of FIG. 1.
Figure 3:
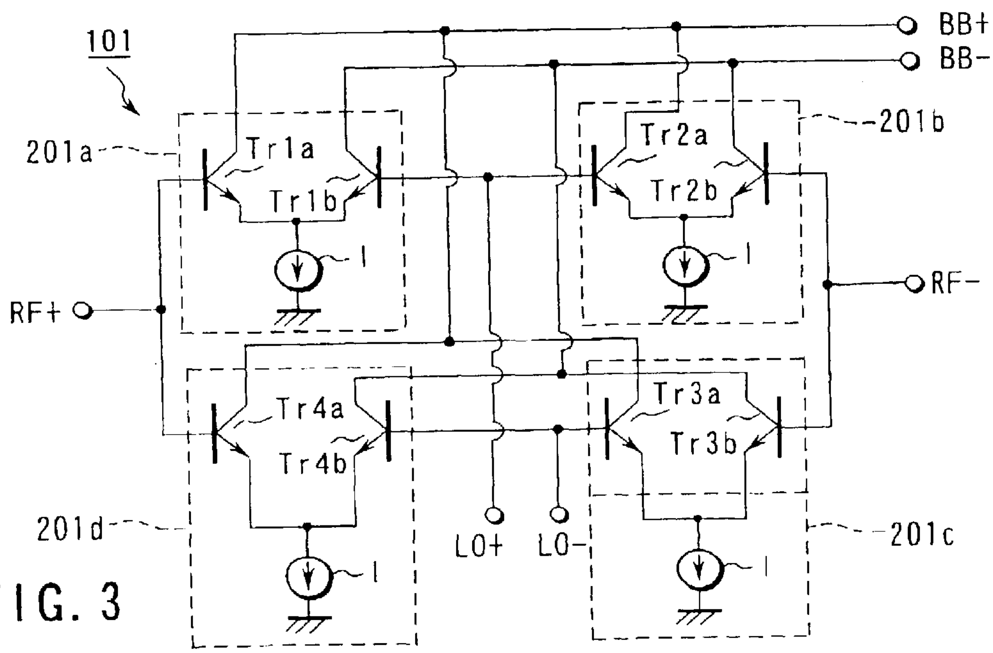
FIG. 3 shows a circuit configuration of the even harmonic mixer of FIG. 2.

FIG. 2 shows a block diagram of an even harmonic mixer using differential bipolar transistor pairs as one example of the even harmonic mixer 101 shown in FIG. 1. FIG. 3 shows a concrete circuit configuration of the mixer shown in FIG. 2.

This even harmonic mixer 101 uses four sets 201*a* to 201*d* of the differential transistor pairs. The base terminals as input terminals are connected in bridge. The LO signal and the modulated signal (RF signal) are separated without being directly connected to each other because of the bridge-connection. Since a differential transistor pair is used, the LO signal is converted into a differential signal of terminals LO+ and LO− (reverse signal of LO+), and the LO signal and modulated signal are input to the even harmonic mixer 101 after the RF signal was converted into a differential signal of terminals RF+ and RF− (reverse signal of RF+).

The state that the LO signal leaks to the RF terminal is a cause of the self-mixture. However, in the even harmonic mixer 101 of bridge-connection, a signal leaked from the LO+ terminal and a signal leaked from the LO− terminal are counteracted to each other as described below. Therefore, no signal leakage is seemingly appeared when viewed from the RF+ and RF− terminals. The output terminals of each differential transistor pair are connected so that the LO differential signals (LO+, LO−) are counteracted to each other, and desired signals after frequency conversion (baseband differential signals BB+ and BB− of FIG. 3) are emphasized to each other.

A conventional even harmonic mixer is a mixer using an anti-parallel diodes pair. However, the signal leakage becomes a problem when such a mixer is used for the direct conversion. This results from that the diode is a 2-terminal element, and the separation between the input and output is only means for separating by frequency. However, in a case using transistors, the base terminal is an input, and the collector terminal is an output. Therefore, the input-to-output separation is assured at least. For this reason, the filter for the signal separation is unnecessary, integration is enabled with a cheap silicon IC. In other words, the even harmonic mixer of the frequency converter related to the present embodiment can use diodes, but the even harmonic mixer using the differential transistor pair is preferable.

The circuit configuration of FIG. 3 will be described hereinafter. FIG. 3 shows a circuit configuration of a bridge-connection even harmonic mixer 101 shown in FIG. 2. The differential transistor pair 201*a* comprises two npn type bipolar transistors Tr1*a* and Tr1*b*, and a constant current source 1 provided between the common emitter terminal of the transistors Tr1*a* and Tr1*b* and the ground. The base terminal of the transistor Tr1*a* is connected to the RF+ terminal, and the base terminal of the transistor Tr1*b* is connected to the LO+ terminal. The collector terminal of the transistor Tr1*a* is connected to a BB+ terminal outputting a baseband signal BB+ and the collector terminal of the transistor Tr1*b* is connected to a BB− terminal outputting a baseband signal BB−.

In the differential transistor pair 201*b*, the base terminal of a transistor Tr2*a* is connected to the LO+ terminal, and the base terminal of the transistor Tr2*b* is connected to the RF− terminal. The collector terminal of the transistor Tr2*a* is connected to the BB+ terminal, and the collector terminal of the transistor Tr2*b* is connected to the BB− terminal.

In the differential transistor pair 201*c*, the base terminal of the transistor Tr3*a* is connected to the LO− terminal, and the base terminal of the transistor Tr3*b* is connected to the RF− terminal. The collector terminal of the transistor Tr3*a* is connected to the BB+ terminal, and the collector terminal of the transistor Tr3*b* is connected to the BB− terminal.

In the differential transistor pair 201*d*, the base terminal of a transistor Tr4*a* is connected to the LO+ terminal, and the base terminal of the transistor Tr4*b* is connected to the RF− terminal. The collector terminal of the transistor Tr4*a* is connected to the BB+ terminal, and the collector terminal of the transistor Tr4*b* is connected to the BB− terminal. All transistors Tr1 to Tr4 constructing the differential transistor pairs are transistors of the same size.

There will be described the reasons that the signal leaked from the LO+ terminal and the signal leaked from the LO− terminal are counteracted to each other in the even harmonic mixer 101 of bridge-connection.

At first, the reason that the signal leaked from the LO+ terminal and the signal leaked from the LO− terminal are counteracted to each other in the RF+ terminal will be described. The signal leaked from the LO+ terminal to the RF+ terminal is the LO+ signal passing through the emitter and base terminals of the transistor Tr1*a* from the base and emitter terminals of the transistor Tr1*b* of the differential transistor pair 201*a*.

On the other hand, the signal leaked from the LO− terminal to the RF+ terminal is the LO− signal passing through the emitter and base terminals of the transistor Tr4*a* from the base and emitter terminals of the transistor Tr4*b* of the differential transistor pair 201*d*. Since the transistors constructing the differential transistor pairs 201*a* and 201*d* are of the same size, the leakage routes of the differential transistor pairs 201*a* and 201*d* are of the same impedance. Since the leakage signals are reverse relational, they are counteracted to each other in the RF+ terminal. Therefore, no leakage signal occurs in an appearance. The similar counteraction occurs in the RF− terminal. Therefore, the signal leaked from the LO+ terminal and the signal leaked from the LO− terminal are counteracted to each other in the RF+ and RF− terminals in the even harmonic mixer 101 of bridge-connection.

(The Second Embodiment)

Figure 4:
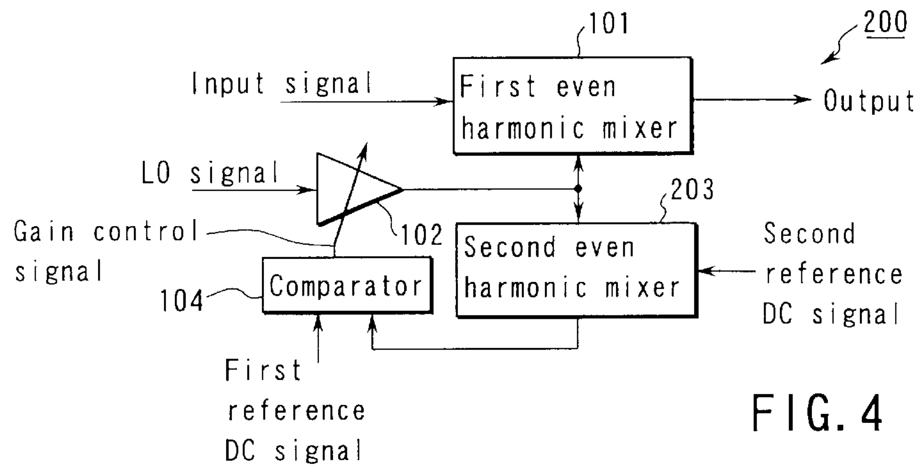
FIG. 4 is a block diagram of a frequency converter related to the second embodiment of the present invention.

FIG. 4 shows a circuit configuration of the frequency converter related to the second embodiment of the present invention. In the second embodiment, like reference numerals are used to designate like structural elements corresponding to those like in the first embodiment and any further explanation is omitted for brevity's sake.

In the frequency converter 200 shown in FIG. 4, the first even harmonic mixer 101 and the second even harmonic mixer 203 are used. Furthermore, the first reference direct current signal is input to the comparator 104, and the second reference direct current signal is input to the second even harmonic mixer.

Figure 5:
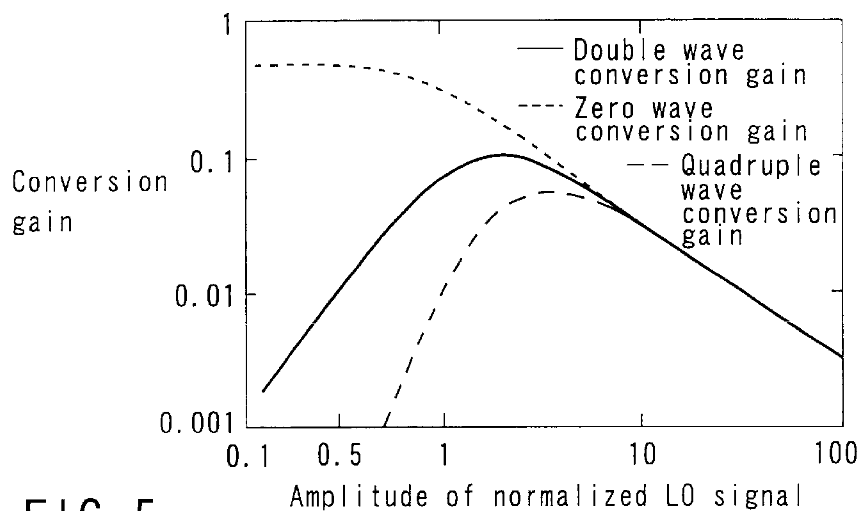
FIG. 5 shows a relation between the conversion gain and the amplitude of LO signal in a case using a pair of differential transistors as the even harmonic mixer.

FIG. 5 shows a simulation result representing a LO signal amplitude dependency to the conversion gain of the even harmonic mixer modeled by the differential bipolar transistor pair such as the differential transistor pair 201*a* of FIG. 2. The abscissa axis shows the amplitude of the normalized LO signal and the ordinate axis shows the conversion gain. As shown in a solid line, when the input signal (RF signal or modulated signal) is a signal whose frequency is 2 times LO signal frequency. The conversion gain (double wave conversion gain) to convert the input signal to a signal (baseband signal) near the DC increases in accordance with increase of the LO signal amplitude. This conversion gain reaches a peak by several times the heat voltage Vt (corresponding to 0.5 of the abscissa axis) and decreases thereafter. When the input signal has the frequency of 4 times the LO signal frequency, the conversion gain (quadruple wave conversion gain) to convert this input signal to the signal near the DC shows a tendency similar to the above. However, the conversion gain (zero wave conversion gain) to output the signal near the DC at that differs from the conversion gain a little.

When the LO signal is small, the gain becomes maximum. When the LO signal increases, the gain shows a tendency to be inversely proportional to the LO signal amplitude. It is a feature of the present embodiment to use the zero wave conversion gain-LO signal amplitude characteristic for amplitude detection of the LO signal. In other words, the present embodiment uses the feature that the zero wave conversion gain and the LO signal amplitude correspond one-on-one, unlike the double wave or quadruple wave conversion gain.

Figure 6:
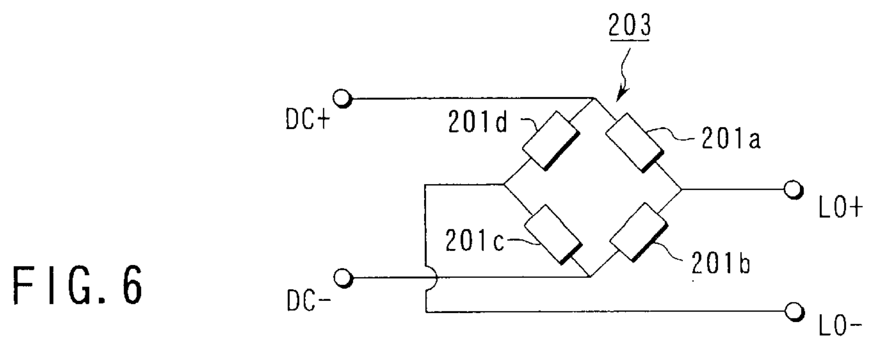
FIG. 6 is a block diagram of the second even harmonic mixer.

FIG. 6 shows a circuit configuration of the second even harmonic mixer 203 used as the LO signal amplitude detector. The second even harmonic mixer 203 has the same circuit configuration as that of the first even harmonic mixer 101. However, the second reference direct current signal (DC+, DC−) is input to the second even harmonic mixer 203 in instead of the input signal (RF+, RF−). The same parts as those of the first even harmonic mixer 101 refer to FIGS. 2 and 3 and the details are omitted.

When the second even harmonic mixer 203 fabricated by differential transistor pairs is used as an amplitude detector, the LO signal amplitude is in inverse proportion to the output DC signal amplitude of the second even harmonic mixer 203. By comparing this output direct current signal with the first reference DC signal, the feedback is performed so that the conversion gain (zero wave conversion gain) from the second reference DC signal of the second even harmonic mixer 203 to the output DC signal becomes a ratio of the first reference DC signal to the second reference DC signal.

It is possible to make the double wave conversion gain of the first even harmonic mixer 101 to a desired value by increasing the LO signal amplitude till the zero wave conversion gain of the second even harmonic mixer 203 as an amplitude detector becomes a desired value. This can be considered to be a master slave controller which uses the second even harmonic mixer 203 as a master circuit and the first even harmonic mixer 101 as a slave circuit. If the second even harmonic mixer 203 is used as an amplitude detector in the feedback loop, it is possible not only to make the conversion gain constant regardless of variation of the LO signal amplitude, but also to suppress variation of the gain due to the characteristic variation of the transistor that causes by the temperature variation.

When the characteristic of the transistor varies by a temperature change, the first even harmonic mixer 101 and the second even harmonic mixer 203 as an amplitude detector receive the same affect. Therefore, the LO signal amplitude is adjusted by the feedback loop so that the gain of the second even harmonic mixer 203 become a desired gain. As a result, the gain of the first even harmonic mixer 101 is compensated, too.

Figure 7:
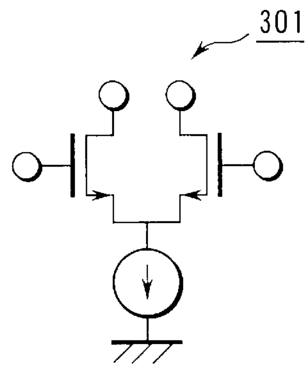
FIG. 7 is a circuit diagram of a pair of differential field effect transistors.

FIG. 7 shows a circuit diagram of a differential transistor pair 301 using field effect transistors (FET). Even if FETs such as MOS transistors are used, it is possible to fabricate the first and the second even harmonic mixers 101 and 203 similarly to the differential transistor pairs 201*a* to 201*d* using the bipolar transistors. However, it is difficult to obtain the conversion gain according to the design since the threshold of the FET and so on fluctuates dependant upon a manufacturing process of a semiconductor device. However, the special feature of the integrated circuit that the characteristics of transistors on the same chip are approximately the same is common to the bipolar transistor and the FET. The frequency converter of the present embodiment uses the second even harmonic mixer 203 as an amplitude detector as a master circuit, determines the LO signal amplitude referring to the conversion gain, and controls the conversion gain of the first even harmonic mixer 101 as the slave circuit. For this reason, if the FET having large characteristic variation in comparison with the bipolar transistor is used, the conversion gain can be kept at a desired value.

The above-mentioned explanation is based on the frequency converter used for the receiver system, but the present embodiment can be applied to a transmitter system. In this case, the input signal input to the frequency converter 100 is a modulating signal generated by converting information of a speech signal to a digital signal. This modulating signal is converted to a signal whose frequency is the sum of a frequency of two or more even numbered times (two times, for example) the LO signal frequency and the frequency of the modulating signal. The converted signal is output as the RF signal. This RF signal is transmitted via a radio antenna (not shown).

(The Third Embodiment)

Figure 8:
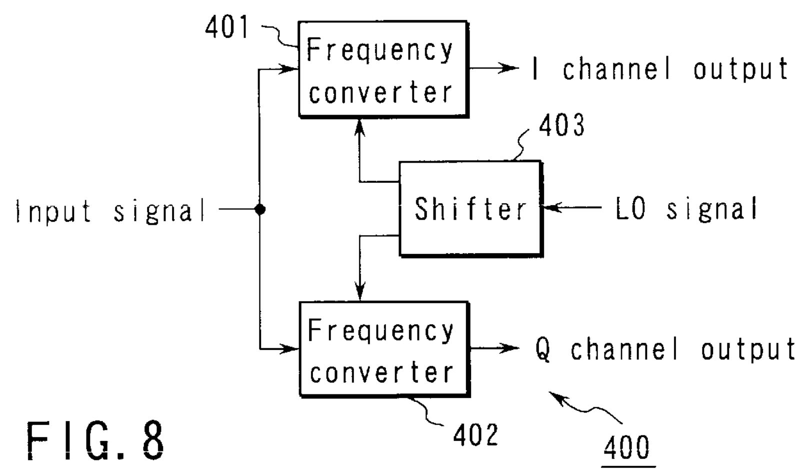
FIG. 8 is a block diagram of an orthogonal demodulator related to the third embodiment of the present invention.

FIG. 8 shows a configuration of an orthogonal demodulator according to the third embodiment of the present invention. The orthogonal demodulator 400 shown in FIG. 8 comprises two frequency converters 401 and 402 related to the first and second embodiments and a phase shifter 403. Assumed that the frequency converter 401 and 402 mix a RF signal wave and a double wave of the LO signal. An inphase signal (RF signal or modulated signal) is input to two frequency converters 401 and 402. The phase shifter 403 outputs LO signals having a phase difference of 45° to the two frequency converters 401 and 402.

The frequency converters 401 and 402 convert the RF input signal to a signal whose frequency is lowered by the frequency of 2 times the LO signal frequency, and divide it into an I channel signal (I signal) and a Q channel signal (Q signal) of baseband. The frequency converters 401 and 402 mix the double wave of the LO signal with the RF signal wave, so that the phase difference of 45° is changed to the phase difference of 90°. For this reason, the phase difference of the phase shifter 403 is set to 45°. Therefore, the phase difference of the phase shifter 403 may be set to 22.5° when the frequency converters 401 and 402 mix the quadruple wave of the LO signal with the RF signal wave.

In the orthogonal demodulator 400 related to the present embodiment, a variable gain amplifier is used for the frequency converters 401 and 402. Therefore, there is not a problem that the higher harmonics of the LO signal occurs. Thus, the orthogonal demodulator 400 can be constructed as an integrated circuit. The I signal and Q signal of precision equal to that of a conventional orthogonal demodulator can be obtained without increase of the number of parts only by inputting the output of the phase shifter 403 to the frequency converters 401 and 402.

Figure 9:
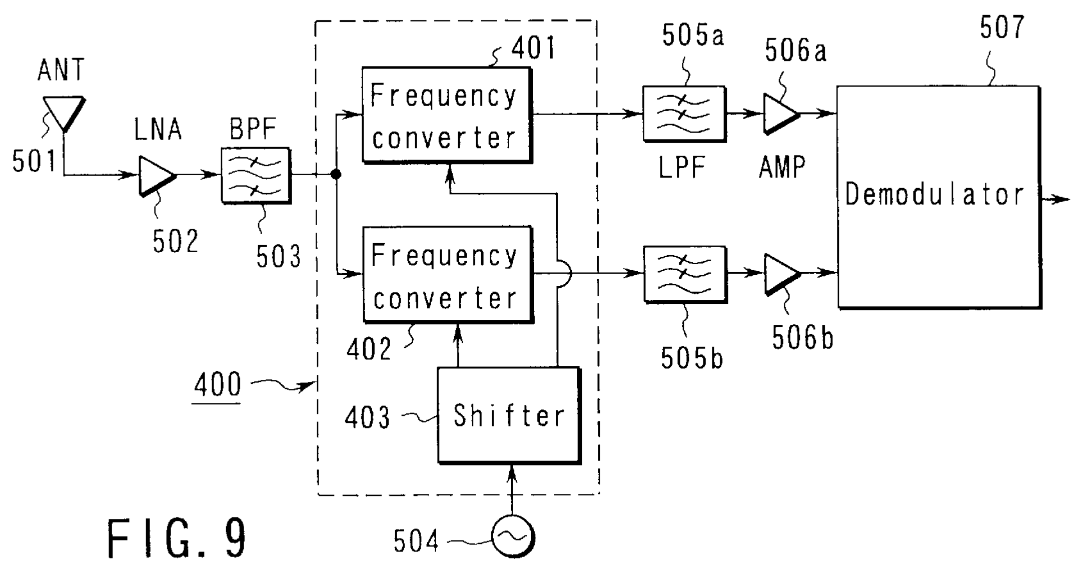
FIG. 9 is a block diagram of a receiver using the orthogonal demodulator shown in FIG. 8.

FIG. 9 shows a configuration of a receiver using the orthogonal demodulator 400 shown in FIG. 8. The receiver comprises a radio antenna (ANT) 501 to receive a RF signal, a low-noise amplifier (LNA) 502 to amplify the RF signal, a band pass filter (BPF) 503 to filter an output of the low-noise amplifier, and an orthogonal demodulator 400 to orthogonal-demodulate the output of the band pass filter 503, and output an I-signal and a Q-signal.

A LO signal generator 504 to generate a local oscillation signal (LO signal) input to an orthogonal demodulator, and low pass filters (LPF) 505*a* and 505*b* which receive the I signal and Q-signal and extract and output the low frequency components are provided. Amplifiers (AMP) 506*a* and 506*b* which amplify the outputs of low pass filters 505*a* and 505*b* and a demodulator 507 which demodulates data such as speech based on the outputs of the amplifiers 506*a* and 506*b* are provided.

In the receiver shown in FIG. 9, the orthogonal demodulator 400 can be constructed as one integrated circuit as described heretofore. Also, a low-noise amplifier 502, a low pass filter 503, an orthogonal demodulator 400, low pass filters 505*a* and 505*b*, and amplifiers 506*a* and 506*b* can be constructed as one integrated circuit.

(The Fourth Embodiment)

Figure 10:
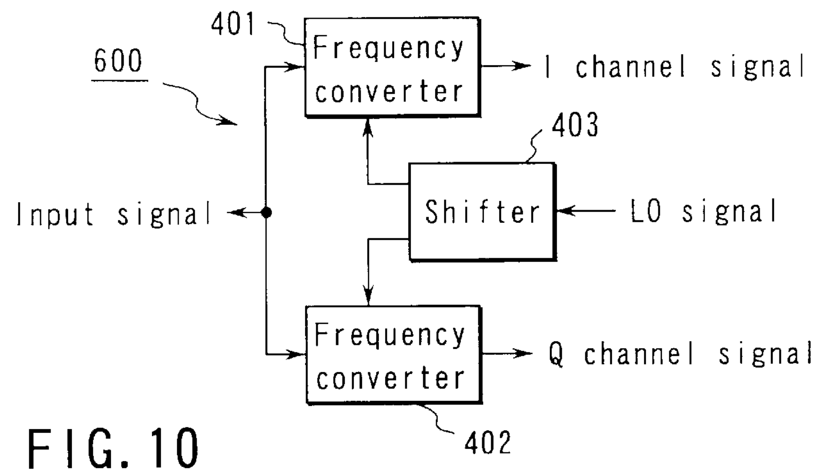
FIG. 10 is a block diagram of an orthogonal modulator related to the fourth embodiment of the present invention.

FIG. 10 shows a configuration of an orthogonal modulator related to the fourth embodiment of the present invention. The embodiment of FIG. 10 is an orthogonal modulator 600 applied to the transmitter. The orthogonal modulator 600 has the same circuit configuration as that of the orthogonal modulator 400 shown in FIG. 8. However, the input-output direction differs from the orthogonal modulator 400 of FIG. 8. In other words, the input signals of the orthogonal modulator 600 are I-signal and Q-signal of baseband. The output of the frequency converter 401 and the output of the frequency converter 402 are added to generate an output signal. This output signal is a RF signal.

Figure 11:
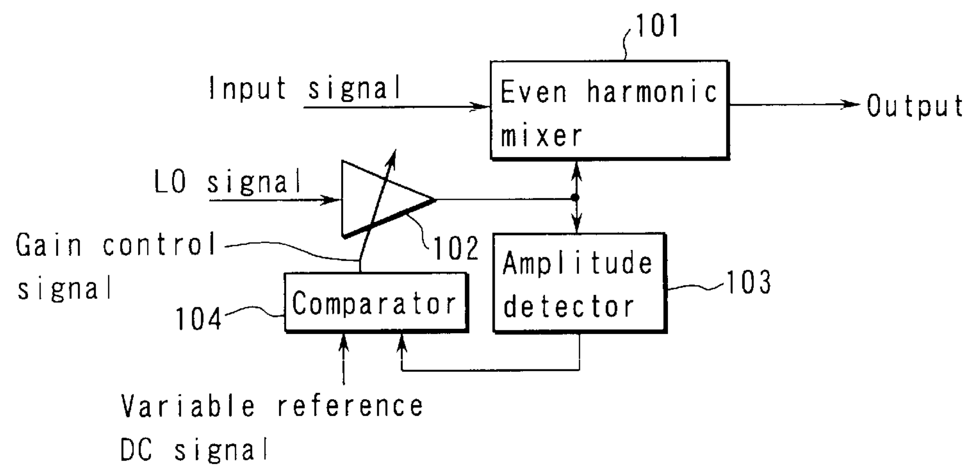
FIG. 11 is a block diagram of a frequency converter related to the fifth embodiment of the present invention.

FIG. 11 shows a configuration of the frequency converter related to the fifth embodiment of the present invention. The configuration of the frequency converter of the present embodiment is the same as that of the frequency converter shown in FIG. 1, but the reference DC signal input to the comparator 104 is variable. The conversion gain of the even harmonic mixer 101 varies according to the LO signal amplitude as described above. Therefore, when the conversion gain is changed in the frequency converter in order to obtain the dynamic range of the receiver, for example, the LO signal amplitude may be varied according to a desired conversion gain. For this reason, the reference DC signal compared with the output DC signal of the amplitude detector 103 in the comparator 104 is changed. The gain of the variable gain amplifier 102 is changed according to a result of comparison of this variable reference DC signal with the output signal of the amplitude detector 103. In other words, changing the reference DC signal voluntarily provides a desired dynamic range of the receiver.

Figure 12:
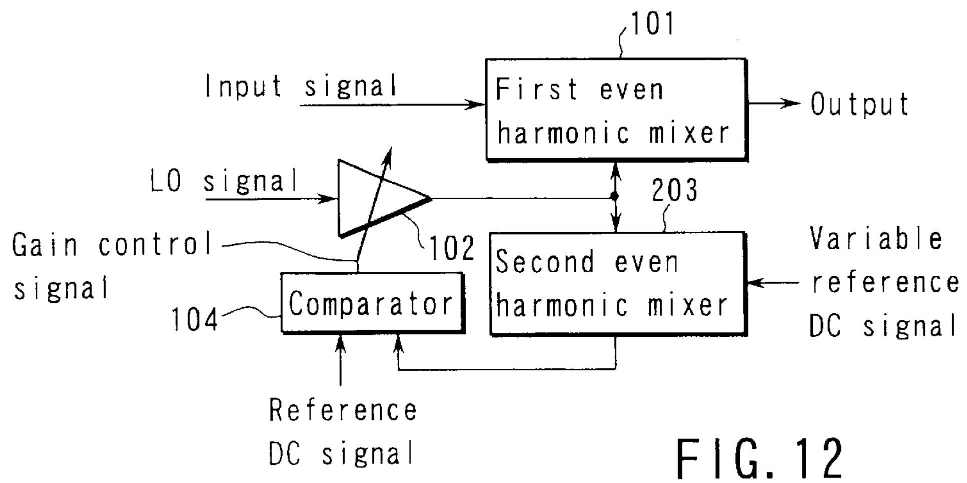
FIG. 12 is a block diagram of a frequency converter related to the sixth embodiment of the present invention.

FIG. 12 shows a configuration of a frequency converter related to the sixth embodiment of the present invention. The configuration of the frequency converter of this embodiment is substantially the same as that of frequency converter shown in FIG. 4, but the second reference DC signal input to the second even harmonic mixer 203 is variable. Changing the second reference DC signal voluntarily can vary the output signal of the second even harmonic mixer 203. This output signal is input to the comparator 104 and is compared with the reference DC signal. The gain of the variable gain amplifier 102 can be changed according to a comparison result of the comparator 104. In other words, the gain of the variable gain amplifier 102 is changed according to a change of the second reference DC signal.

As thus described, the frequency converter of the present embodiment can be used as a frequency converter having a variable gain function. The first reference DC signal may be variable in this embodiment, too.

Figure 13:
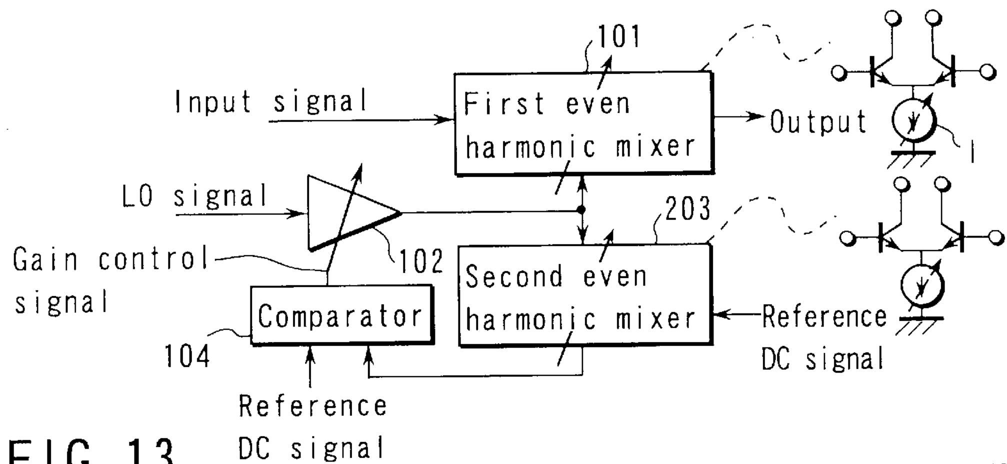
FIG. 13 is a block diagram of a frequency converter related to the seventh embodiment of the present invention.

FIG. 13 shows a configuration of a frequency converter related to the seventh embodiment of the present invention. The configuration of the frequency converter of this embodiment is substantially the same as that of the frequency converter shown in FIG. 4, but in this embodiment, each of the first and second even harmonic mixers 101 and 203 comprises a differential transistor pair Tr and a variable current source I. In this embodiment, distortion property and noise property can be kept in preferable status with a constant conversion gain by changing a tail current according to an input signal level. As a result, a current can be increased only when making the frequency converter activate with preferable status of the distortion property, but the current can be decreased when making it to activate with other status. This makes a desired dynamic range ensure with a low consumption current.

Figure 14:
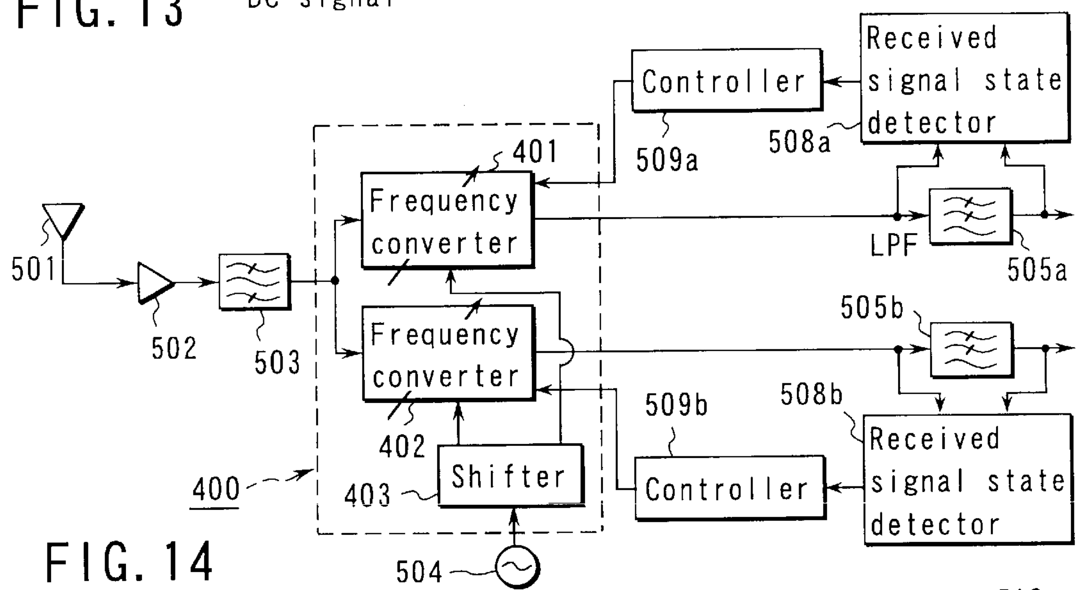
FIG. 14 is a block diagram of a receiver related to the eighth embodiment of the present invention.

FIG. 14 shows a configuration of a receiver using an orthogonal demodulator related to the eighth embodiment of the present invention. The present embodiment corresponds to the embodiment of FIG. 9, but in the present embodiment, received signal status detectors 508*a* and 508*b* are connected to LPFs 505*a* and 505*b*. The received signal status detectors 508*a* and 508*b* detects a power of the whole signal input to the LPFs and a level of a desired wave or an interference wave using at least one of an input of the LPFs and an intermediate output of the LPFs. The detected signals of the received signal status detectors 508*a* and 508*b* are input to the controllers 509*a* and 509*b*. The controllers 509*a* and 509*b* set the frequency converters 401 and 402, respectively, to such bias states that the frequency converter operates with the state that the distortion property of the frequency converter is preferable when the interference wave level is large.

As thus described, the receiver of high-performance and low power consumption can be realized by operating the frequency converters 401 and 402 with reasonable bias condition according to the received signal status.

Figure 15:
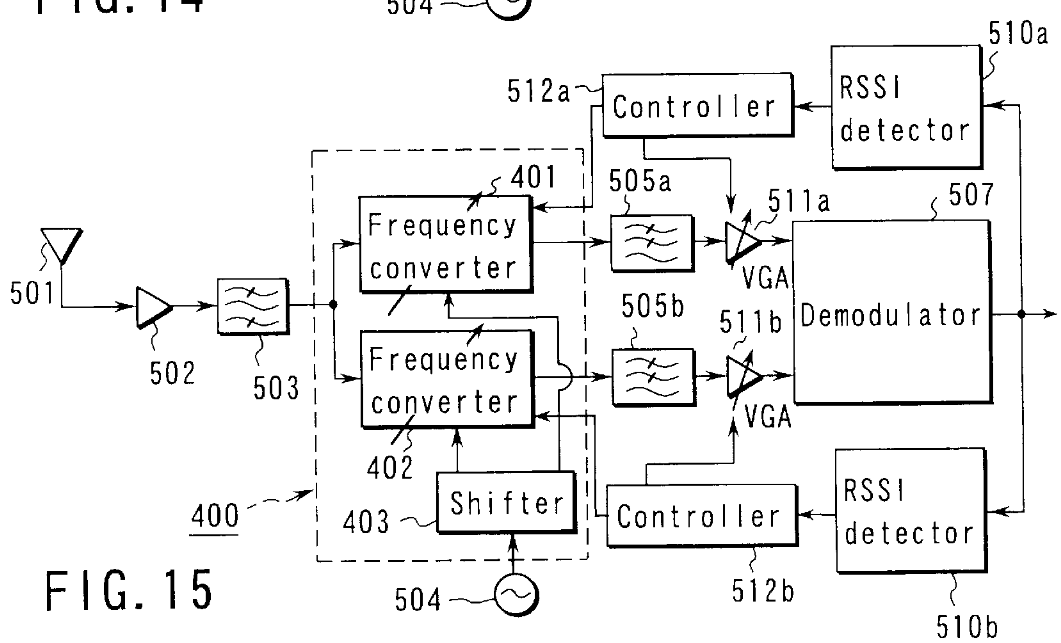
FIG. 15 is a block diagram of a receiver related to the ninth embodiment of the present invention.

FIG. 15 shows a configuration of a receiver using an orthogonal demodulator related to the eighth embodiment of the present invention. This embodiment corresponds to the embodiment of FIG. 9, too, but RSSI (Received Signal Strength Indicator) detectors 510*a* and 510 are provided as received signal status detectors in the present embodiment. Further variable gain amplifiers (VGA) 511*a* and 511*b* are provided on the rear stages of the LPFs 505*a* and 505*b*, respectively.

The controllers 512*a* and 512*b* set the conversion gains of the frequency converters 401 and 402 so as to provide desired reception characteristics according to the reception electrolysis strength detected by the RSSI detectors 510*a* and 510*b*, and set gains of VGAs 512*a* and 512*b* so that the gain of the whole receiver becomes constant. For example, when the reception electrolysis strength is strong, the conversion gains of the frequency converters 401 and 402 are decreased, and the gains of the VGA 512*a* and 512*b* are increased. On the other hand, when the reception electrolysis strength is weak, the conversion gains of the frequency converters 401 and 402 are increased and the gains of the VGA 512*a* and 512*b* are decreased. As a result, the gain distribution of the frequency converter 401 and 402 and the VGA 512*a* and 512*b* can be optimized.

In the above embodiments, the conductivity type of the transistors Tr1 to Tr4 of FIG. 3 may be pnp type. Further, the first channel type of FET of FIG. 7 may be p channel type, if all FETs constructing the first and second even harmonic mixers 101 and 203 are the same channel type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency converter to which an input signal, a local oscillation signal and a reference direct current signal are supplied, the frequency converter comprising:

a variable gain amplifier which amplifies the local oscillation signal according to a gain control signal and outputs an amplified local signal;

an even harmonic mixer which is supplied with the input signal and the amplified local oscillation signal and outputs an output signal whose frequency is a sum of a first frequency of the input signal and a second frequency of two or more even numbered times a frequency of the amplified local oscillation signal or a difference between the first frequency and the second frequency;

an amplitude detector which is supplied with the amplified local oscillation signal and outputs a direct current signal having an amplitude corresponding to an amplitude of the amplified local oscillation signal; and a comparator which compares the direct current signal of the amplitude detector with the reference direct current signal to generate an output signal as the gain control signal.

2. A frequency converter according to claim 1, wherein the even harmonic mixer includes differential transistor pairs each having a pair of transistors.

3. A frequency converter according to claim 2, wherein the reference direct current signal corresponds to a first reference direct current signal, the even harmonic mixer is constructed by a first even harmonic mixer, and the amplitude detector is constructed by a second even harmonic mixer having the same circuit configuration as the first even harmonic mixer, and supplied with a second reference direct current signal.

4. A frequency converter according to claim 1, wherein the even harmonic mixer includes four differential bipolar transistor pairs each having a pair of bipolar transistors.

5. A frequency converter according to claim 4, wherein the reference direct current signal corresponds to a first reference direct current signal, the even harmonic mixer is constructed by a first even harmonic mixer, and the amplitude detector is constructed by a second even harmonic mixer having the same circuit configuration as the first even harmonic mixer, and supplied with a second reference direct current signal.

6. A frequency converter according to claim 1, wherein the even harmonic mixer includes four differential field effect transistor pairs each having a pair of field effect transistors.

7. A frequency converter according to claim 6, wherein the reference direct current signal corresponds to a first reference direct current signal, the even harmonic mixer is constructed by a first even harmonic mixer, and the amplitude detector is constructed by a second even harmonic mixer having the same circuit configuration as the first even harmonic mixer, and supplied with a second reference direct current signal.

8. A frequency converter according to claim 7, wherein the second even harmonic mixer is supplied with a variable reference direct current signal as the reference direct current signal to adjust a conversion gain of the second even harmonic mixer.

9. A frequency converter according to claim 7, wherein the first even harmonic mixer and the second even harmonic mixer each include a variable bias unit configured to vary a bias state of the even harmonic mixer.

10. A frequency converter according to claim 1, wherein the even harmonic mixer is supplied with a variable reference direct current signal as the reference direct current signal to adjust a conversion gain of the even harmonic mixer.

11. A frequency converter according to claim 1, wherein the reference direct current signal is a first reference direct current signal, the even harmonic mixer is constructed by a first even harmonic mixer, and the amplitude detector is constructed by a second even harmonic mixer having the same circuit configuration as the first even harmonic mixer, and supplied with a second reference direct current signal.

12. An orthogonal demodulator using an input signal, a first local oscillation signal, a second local oscillation signal, a first reference signal, and a second reference signal, the orthogonal demodulator comprising:

- a first frequency converter including:
  - a first variable gain amplifier which amplifies the first local oscillation signal according to a first gain control signal, and outputs an amplified first local oscillation signal;
  - a first even harmonic mixer which is supplied with the input signal and the amplified first local oscillation signal and outputs an output signal whose frequency corresponds to a difference between a frequency of the input signal and a frequency of two or more even numbered times a frequency of the amplified first local oscillation signal;
  - a first amplitude detector which is supplied with the amplified first local oscillation signal and outputs a first direct current signal having an amplitude corresponding to an amplitude of the amplified first local oscillation signal; and
  - a first comparator which compares the first reference direct current signal with the first direct current signal to generate an output signal as the first gain control signal;
- a second frequency converter including:
  - a second variable gain amplifier which amplifies the second local oscillation signal according to a second gain control signal, and outputs an amplified second local oscillation signal;
  - a second even harmonic mixer which is supplied with the input signal and the amplified second local oscillation signal and outputs an output signal whose frequency corresponds to a difference between a frequency of the input signal and a frequency of two or more even numbered times a frequency of the amplified second local oscillation signal;
  - a second amplitude detector which is supplied with the amplified second local oscillation signal and outputs a second direct current signal having an amplitude corresponding to an amplitude of the amplified second local oscillation signal; and
  - a second comparator which compares the second reference direct current signal with the second direct current signal to generate an output signal as the second gain control signal; and
- a phase shifter which outputs the first local oscillation signal and the second local oscillation signal with a given phase difference therebetween to the first frequency converter and the second frequency converter.

13. An orthogonal demodulator according to claim 12, wherein the phase difference is 90°/n, when the frequency of the input signal is n times the frequency of the first local oscillation signal and the second local oscillation signal, where n is two or more even number.

14. An orthogonal modulator using an input signal, a first local oscillation signal, a second local oscillation signal, a first reference signal, and a second reference signal, the orthogonal demodulator comprising:

- a first frequency converter including:
  - a first variable gain amplifier which amplifies the first local oscillation signal according to a first gain control signal, and outputs an amplified first local oscillation signal;
  - a first even harmonic mixer which is supplied with the I signal of baseband and the amplified first local oscillation signal and outputs an output signal whose frequency corresponds to a sum of a frequency of the input signal and a frequency of two or more even numbered times a frequency of the amplified first local oscillation signal;
  - a first amplitude detector which is supplied with the amplified first local oscillation signal and outputs a first direct current signal having an amplitude corresponding to an amplitude of the amplified first local oscillation signal; and
  - a first comparator which compares the first reference direct current signal with the first direct current signal to generate an output signal as the first gain control signal;
- a second frequency converter including:
  - a second variable gain amplifier which amplifies the second local oscillation signal according to a second gain control signal, and outputs an amplified second local oscillation signal;
  - a second even harmonic mixer which is supplied with the Q signal of baseband and the amplified second local oscillation signal and outputs an output signal whose frequency corresponds to a sum of a frequency of the Q signal and a frequency of two or more even numbered times a frequency of the amplified second local oscillation signal;
  - a second amplitude detector which is supplied with the amplified second local oscillation signal and outputs a first direct current signal having an amplitude corresponding to an amplitude of the amplified first local oscillation signal; and
  - a second comparator which compares the second reference direct current signal with the second direct current signal to generate an output signal as the second gain control signal; and a phase shifter which outputs the first local oscillation signal and the second local oscillation signal with a given phase difference therebetween to the first frequency converter and the second frequency converter.

15. An orthogonal modulator according to claim 14, wherein the phase difference is 90°/n, when the frequency of the input signal is n times the frequency of the first local oscillation signal and the second local oscillation signal, where n is two or more even number.

16. A receiver comprising:

the frequency converter according to claim 10;

a received signal state detector configured to detect a received signal state and output a detection signal; and a controller supplied with the detection signal and configured to output a control signal used for setting a conversion gain and an operation state to the frequency converter.

17. A receiver comprising:

the frequency converter according to claim 11;

a received signal state detector configured to detect a received signal state and output a detection signal; and a controller supplied with the detection signal and configured to output a control signal used for setting a conversion gain and an operation state to the frequency converter.

18. A receiver comprising:

the frequency converter according to claim 12;

a received signal state detector configured to detect a received signal state and output a detection signal; and a controller supplied with the detection signal and configured to output a control signal used for setting a conversion gain and an operation state to the frequency converter.

* * * * *